US008631565B2

(12) United States Patent
Becker et al.

(10) Patent No.: US 8,631,565 B2
(45) Date of Patent: Jan. 21, 2014

(54) METHOD FOR MANUFACTURING A SOLAR MODULE

(75) Inventors: Christian Becker, Bruchweiler (DE); Hans-Juergen Eickelmann, Nieder-Hilbersheim (DE); Michael Haag, Rodenbach (DE); Rainer Klaus Krause, Kostheim (DE); Thorsten Muehge, Budenheim (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 861 days.

(21) Appl. No.: 12/203,781

(22) Filed: Sep. 3, 2008

(65) Prior Publication Data

US 2010/0050428 A1 Mar. 4, 2010

(51) Int. Cl.
*H05K 3/30* (2006.01)

(52) U.S. Cl.
USPC ............ 29/832; 29/623.1; 29/830; 29/834; 136/206; 323/906

(58) Field of Classification Search
USPC .............. 136/206, 244, 246, 249; 323/906; 429/149; 438/67; 29/623.1, 830–832, 29/834
See application file for complete search history.

(56) References Cited

U.S. PATENT DOCUMENTS

| | | | |
|---|---|---|---|
| 4,003,756 A * | 1/1977 | Abrams | 136/246 |
| 4,513,167 A * | 4/1985 | Brandstetter | 136/206 |
| 4,834,805 A | 5/1989 | Erbert | |
| 5,118,361 A * | 6/1992 | Fraas et al. | 136/246 |
| 5,460,659 A | 10/1995 | Krut | |
| 6,399,874 B1 * | 6/2002 | Olah | 136/259 |
| 2008/0121269 A1 | 5/2008 | Welser et al. | |

* cited by examiner

Primary Examiner — Peter DungBa Vo
Assistant Examiner — Jeffrey T Carley
(74) Attorney, Agent, or Firm — King & Spalding; Steven L Bennett

(57) ABSTRACT

A method for manufacturing a solar concentrator cell module assembly within an integrated circuit process, which solar concentrator cell module assembly includes at least one solar device and which solar device includes one printed circuit board and one Fresnel lens. A printed circuit board is assembled according to a pre-defined circuit board base design layout that allows pick and place of a single solar concentrator cell chip onto a circuit board base. Connections are provided for the solar concentrator cell chip in a serialized or a parallelized arrangement on the circuit board base, and a plurality of openings are formed in the circuit board base below a backside of the solar concentrator chip to enable attachment of cooling fingers. A solar device based on a solar device layout is assembled using the assembled circuit board base and one Fresnel lens, the solar device having a solar concentration ratio by modifying the solar device surface versus the solar cell surface and covering a full extension of the circuit board base, which circuit board base provides means for interconnecting a plurality of the solar devices to one another to form the solar concentrator cell module assembly.

2 Claims, 11 Drawing Sheets

METHOD FOR MANUFACTURING A SOLAR MODULE

BACKGROUND OF THE INVENTION

1. Field of the Invention

This invention relates to solar modules and more particularly to a method for manufacturing a solar concentrator based module.

2. Description of Background

Currently, it is known how to utilize a Fresnel lens to build a solar concentrator device. However, a disadvantage of existing art Fresnel solar concentrator devices is that there is presently no known method or design for volume production of such devices.

SUMMARY OF THE INVENTION

The shortcomings of the prior art are overcome and additional advantages are provided through embodiments of the invention proposing a method for manufacturing a solar concentrator cell module assembly within an integrated circuit manufacturing process, which solar concentrator cell module assembly comprises at least one solar device and which solar device comprises one printed circuit board and one cylindrical Fresnel lens.

The method for embodiments of the invention involves assembling a printed circuit board according to a pre-defined circuit board base design layout that allows pick and place of a single solar concentrator cell chip onto a circuit board base. Connections are provided for the solar concentrator cell chip in a serialized or a parallelized arrangement on the circuit board base, and a plurality of openings are formed in the circuit board base underneath the backside of the solar concentrator chip to enable attachment of cooling means.

According to embodiments of the invention a solar device based on a solar device layout is assembled using the assembled circuit board base and one cylindrical Fresnel lens, the solar device having a solar concentration ratio by modifying the solar device surface versus the solar cell surface and covering a full extension of the circuit board base, which circuit board base provides means for interconnecting a plurality of the solar devices to one another to form the solar concentrator cell module assembly.

Technical Effects

As a result of the summarized invention, technically we have achieved a solution for implementing methods for manufacturing an advanced concentrator cell module assembly utilizing printed circuit board (PCB) technology and single cell monitoring with electronics placed on the device PCB, enabling high automation capability, high efficiency and low cost.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
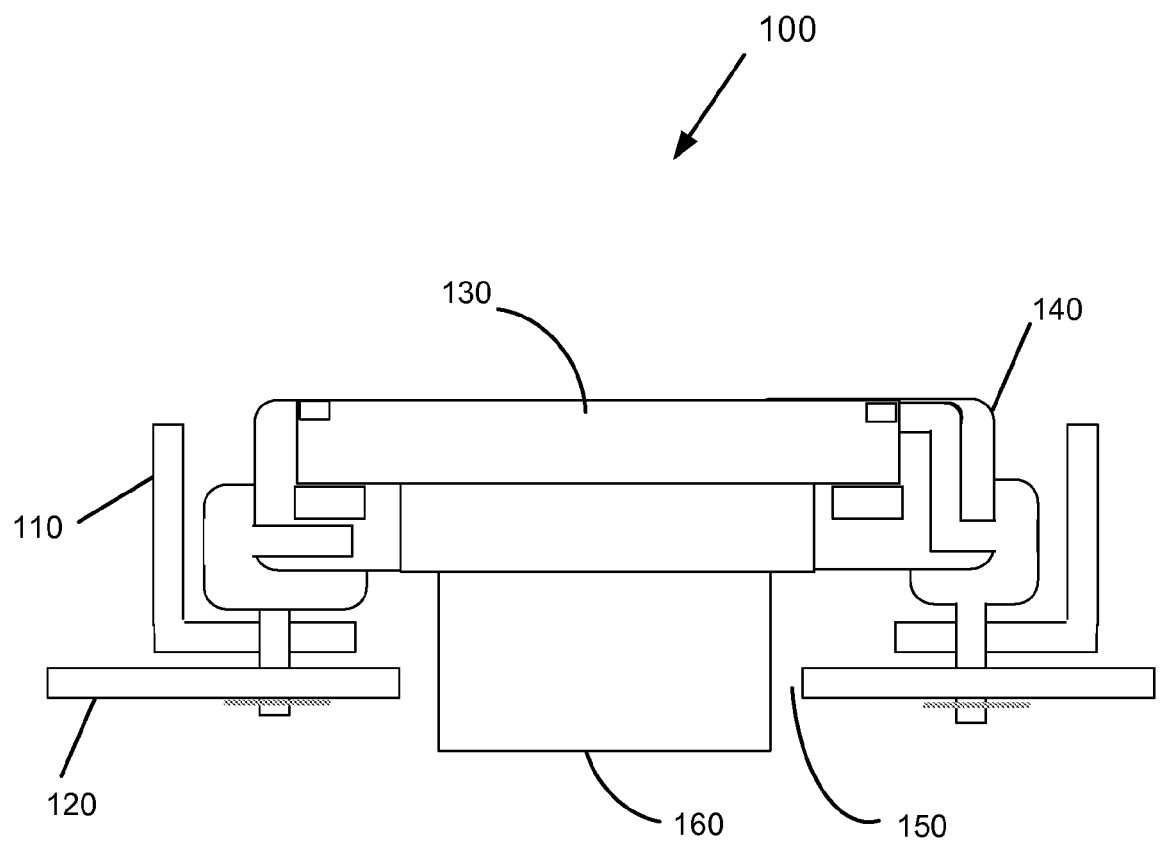
FIG. 1 is a schematic representation of an example of a base unit with solar chip/PCB connection for embodiments of the invention.

The detailed description explains the preferred embodiments of the invention, together with advantages and features, by way of example with reference to the drawings.

DETAILED DESCRIPTION OF THE INVENTION

Embodiments of the invention propose a method for manufacturing an advanced concentrator cell module assembly, enabling high automation capability, high efficiency, and low cost. The module assembly for embodiments of the invention utilizes printed circuit board (PCB) technology and single cell monitoring with electronics placed on the device PCB.

Embodiments of the invention propose the method for manufacturing a solar module within a standard integrated circuit manufacturing process, which solar module comprises at least one solar device and which solar device comprises one PCB and one Fresnel lens. The method for embodiments of the invention involves, for example, defining a process routing for manufacturing of solar devices based on solar concentrator chips by using pre-defined integrated circuit process routing steps.

According to embodiments of the invention, the pre-defined process routing steps involve, for example, assembling a PCB based on a PCB design layout allowing pick and place of the single solar concentrator chips onto the PCB. Embodiments of the invention provide flexibility to connect the solar concentrator chips in a serialized or parallelized arrangement on the PCB. In embodiments of the invention, PCB openings are provided below the solar concentrator chip backside to enable attachment of cooling fingers.

The pre-defined process routing steps for embodiments of the invention further involve, for example, assembling a solar device based on a solar device layout by using the assembled PCB and one cylindrical Fresnel lens, the solar device being characterized by having solar concentration ratio by modifying the solar device surface versus the solar cell surface and that it covers the PCB in its full extension, which PCB provides means for easy interconnecting of each single solar device to one another resulting in a solar module.

According to embodiments of the invention, a solar module based on a solar module layout is assembled by using a plurality of the solar devices and interconnecting them to each other according to the defined layout.

A basic concept for embodiments of the invention is the assembly of a solar module using solar concentrator cells. The module itself is assembled using PCBs containing concentrator cells. An objective of embodiments of the invention is to place as many cells as possible on the module to maximize the effective surface. The concentration is realized using cylindrical Fresnel lenses across the entire width of the module. In the case of single concentrator cells, squared spherical Fresnel lenses are used. The modules are designed as flexible to realize any type of PCP/cell serialization as well as parallelization. The modularity of the design allows the replacement of individual cells as well as the entire PCB.

An aspect of embodiments of the invention relates to monitoring the individual cells or parallelized PCBs concerning functionality and performance.

Embodiments of the invention involve more than one approach to assembling a solar module with concentrator cells. For an example, assume a cell at 2×2 cm$^2$. The Fresnel lenses used for the single cell application are 10×10 cm$^2$ squared spherical lenses with a concentration ratio of 25. For another example, in the case of cell lines, cylindrical lenses are used, with a width of 12 cm and a concentration greater than 10. In other words, the application can be based on a single cell set-up as well as on multiple cells in a line.

FIG. 1 is a schematic representation of an example of a base unit with a solar chip/PCB connection for embodiments of the invention. The base substrate of the module for embodiments of the invention has fixtures in which standard PCBs fit. Typically, the PCB length can be 20 cm to fit 10 2×2 cells. Each PCB builds a base module 100 as illustrated in FIG. 1. With a 60 cm wide module, for example, three PCBs or base modules could be assembled. The connecting device 110 for the PCB 120 is on the module substrate, as well as the back side of the base module as shown in FIG. 1. The PCB fixtures on the module substrate already have connecting wiring. The wiring can be selected depending on whether the PCB 120 should be serialized or parallelized.

In the process flow for embodiments of the invention, the front end of the module involves the manufacture of a solar cell 130, for example, from semiconductor scrap wafers, and the backend involves the manufacture of a solar chip and packaging 140. The PCB assembly can be serialized or parallelized depending on application requirements. The PCB 120 is assembled into the base module 100, and multiple base modules are used to form the module assembly. The size of the final module depends on the number of base modules used. The base module 100 is the smallest module unit which is fully functional. The entire manufacturing and assembly process is fully automated. The PCB 120 has on the backside an opening 150 to be able to attach the cooling device (i.e., finger) 160 to the solar cell 130. The design enables fully automated assembly technologies.

Figure 2:
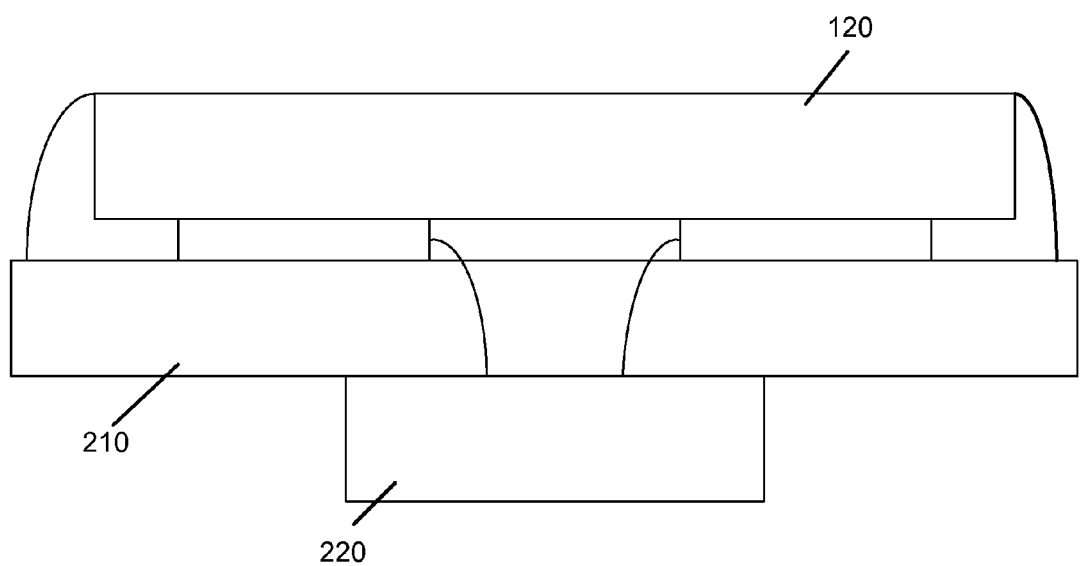
FIG. 2 is a schematic representation of an example of the connection of the PCB to the base module substrate for embodiments of the invention.

FIG. 2 is a schematic representation of an example of the connection of the PCB 120 to the base module substrate 210 for embodiments of the invention. The base module 100 is a generic unit which enables easy large module assembly for any size as well as voltage/current constellation. The base module is a frame, which can be made of metal, with a box height matching the Fresnel lens focus length required for X suns concentration. The PCB 120 is assembled into the box using fixture technology. With the assembly of the PCB 120, the contact to the base module 100 is made. The base module itself already contains the contact lines to the contact box 220 which is located on the backside of the base module 100.

Figure 3:
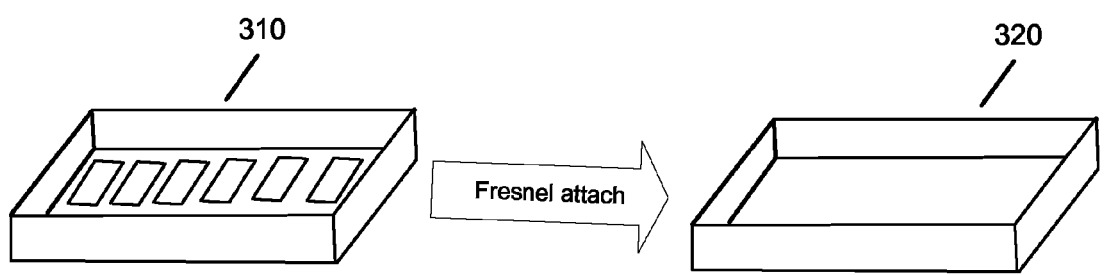
FIG. 3 is a schematic representation of an example of the placement of the Fresnel lens on the base module box for embodiments of the invention.

FIG. 3 is a schematic representation of an example of the placement of the Fresnel lens 310 on the base module box 320 for embodiments of the invention. The Fresnel lens itself is placed on the top of the base module box 320. The lens 310 is held by a simple fixture so that it can easily be replaced for maintenance and cleaning purposes.

Figure 4:
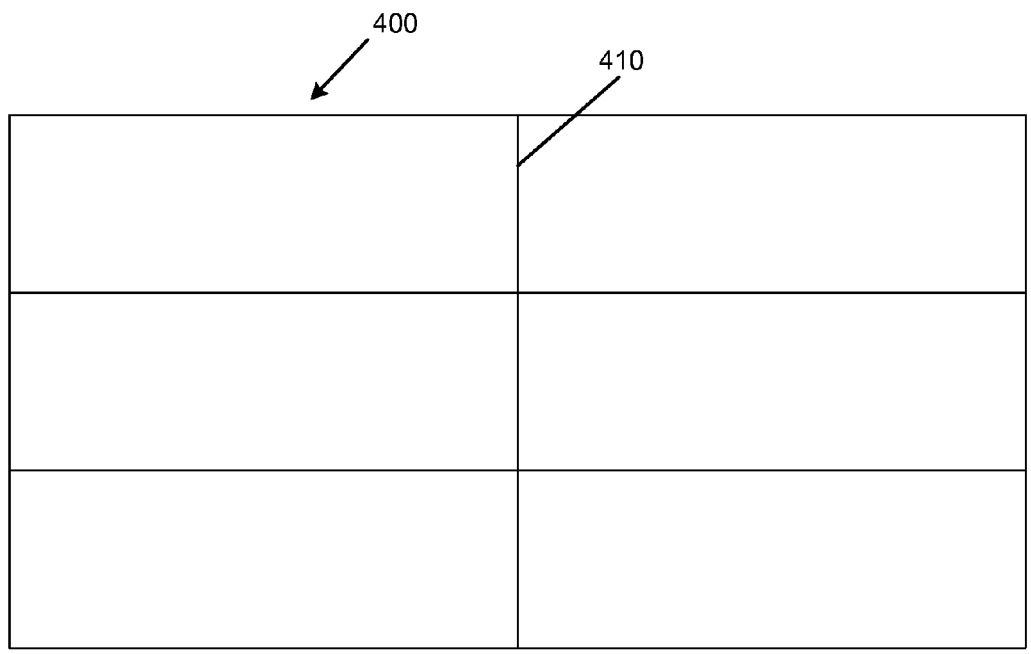
FIG. 4 is a schematic representation of an example of a top view of several assembled base modules for embodiments of the invention.

FIG. 4 is a schematic representation of an example of a top view of several assembled base modules 400 for embodiments of the invention. The modules use at the touching walls 410 simple metal latches to secure easy assembly. The latches are designed to fix the base modules and hold them together.

Latches are used for fixing the base modules 400 and holding them together for embodiments of the invention, and a base module box assembly is fixed and held together by the latch fixture for embodiments of the invention. The latches are positioned at all walls around the base module 100 in order to assure that another base module 100 can be attached on each side. The backside of the base module 100 has an opening 150 to enable the cooling attachment to the solar cell 130. Also the connector boxes are placed on the base module backside.

Figure 5:
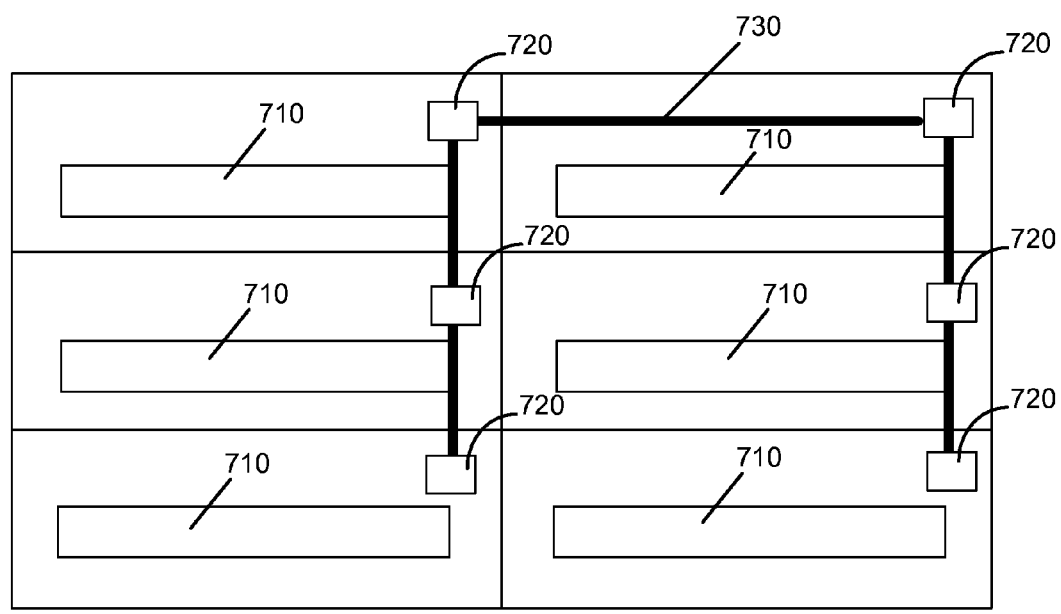
FIG. 5 is a schematic representation of an example of the layout of the base module backside for embodiments of the invention.

FIG. 5 is a schematic representation of an example of the layout of the base module backside for embodiments of the invention. The elongate boxes 710 are the openings on the backside of the base module for the cooling attachment. The square boxes 720 are the connector boxes. The lines 730 show the connector cables making either parallel or serial links between the base modules.

Figure 6:
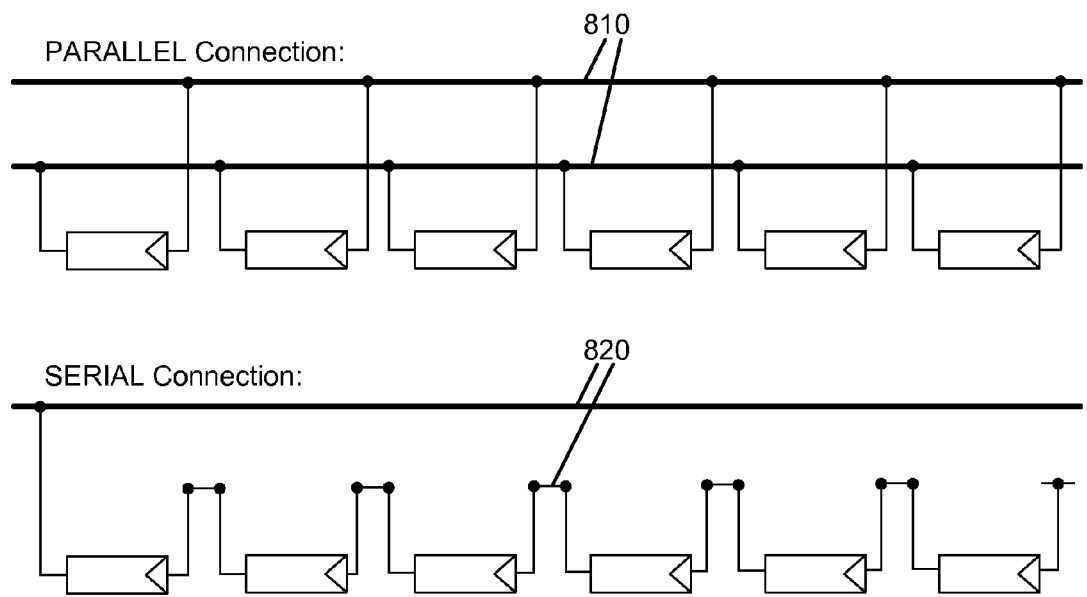
FIG. 6 is a schematic representation of an example of the linking of connector boxes in either parallel or in series according to embodiments of the invention.

FIG. 6 is a schematic representation of an example of the linking of connector boxes in either parallel or in series according to embodiments of the invention. The connector boxes are linked with special cables to secure either parallel 810 or serial 820 connected base modules.

Figure 7:
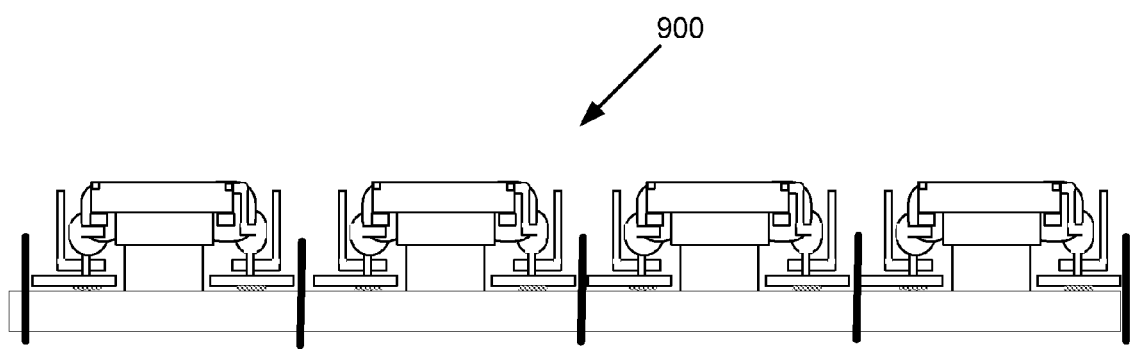
FIG. 7 is a schematic representation of an example of the linking of connector boxes for embodiments of the invention.

FIG. 7 is a schematic representation of an example of the linking of connector boxes 900 for embodiments of the invention. In case of using several suns per solar cell, the device heats up and runs less efficient due to high temperature. This requires a cooling of the device using a specific technology. Optimized cooling is secured by using good metal contact on the solar cell backside as well as the cooling metal sheet on which the PCB is mounted. The cooling finger/device and cooling finger/metal sheet interfaces are optimized using special cooling paste. The base substrate can be either completely out of metal or partially metal. This is required to transport the heat off the device through the individual cooling fingers.

Figure 8:
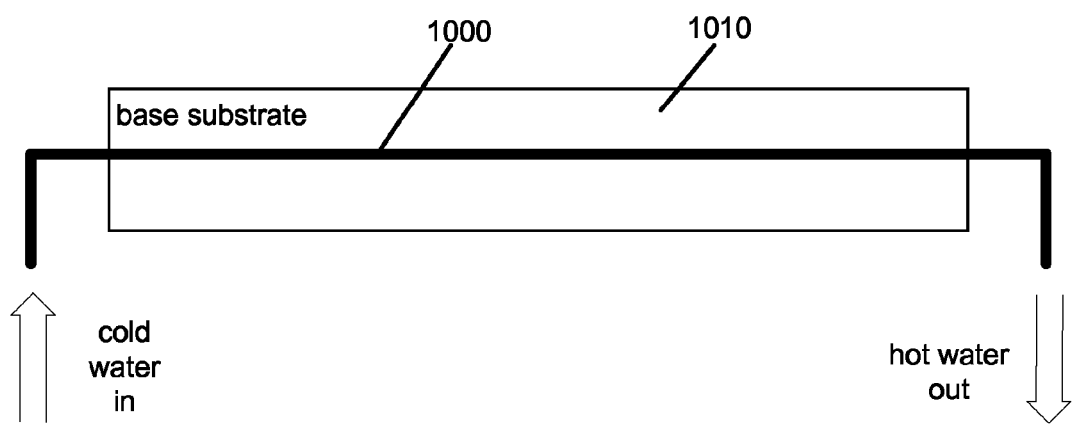
FIG. 8 is a schematic representation of an example of active cooling of the device with water pipes for embodiments of the invention.

FIG. 8 is a schematic representation of an example of active cooling of the device with water pipes 1000 for embodiments of the invention. The base substrate 1010 can be, in case of very high heat dissipation on the device, cooled actively. This can be done through direct water cooling within the substrate layer with the application, for example, of a type of water pipes 1000 within the substrate 1010.

Figure 9:
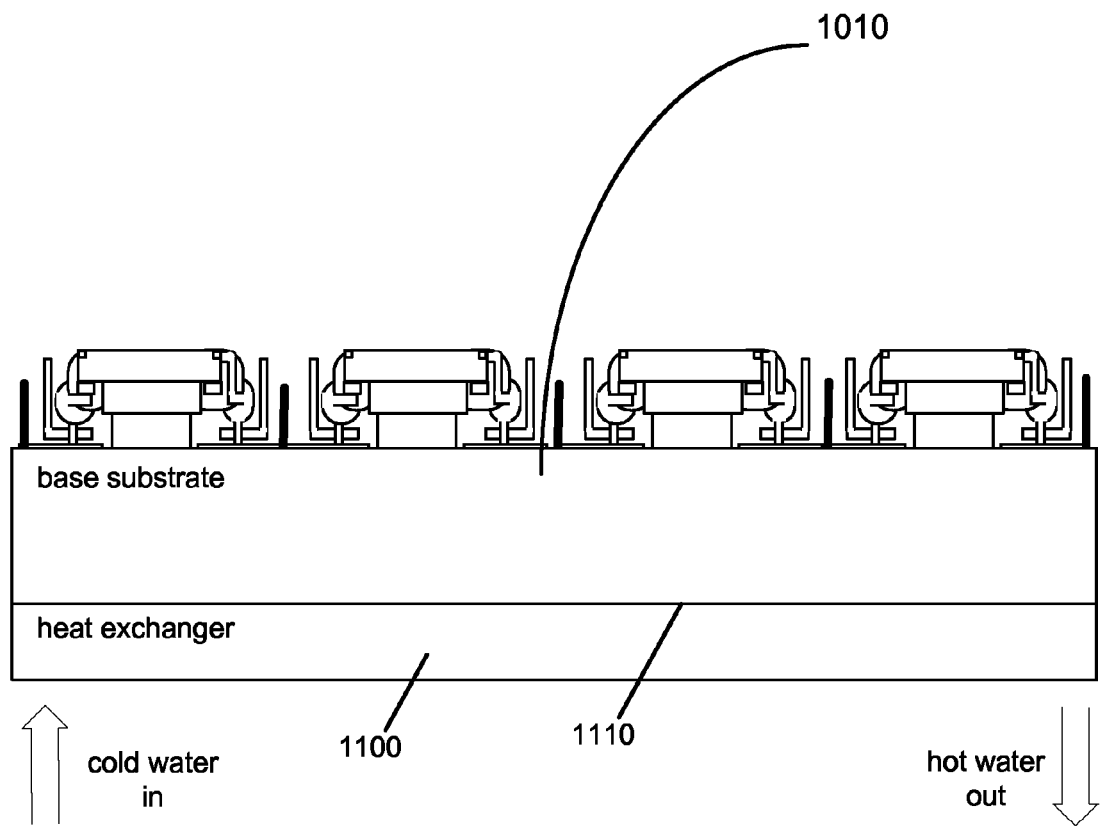
FIG. 9 is a schematic representation of an example of active cooling of the device with a heat exchanger for embodiments of the invention.

FIG. 9 is a schematic representation of an example of active cooling of the device with a heat exchanger 1100 for embodiments of the invention. A possibility is to attach the heat exchanger 1100 directly to the substrate backside 1110. Cooling certainly can be an issue when approaching 50 suns and higher.

Figure 10:
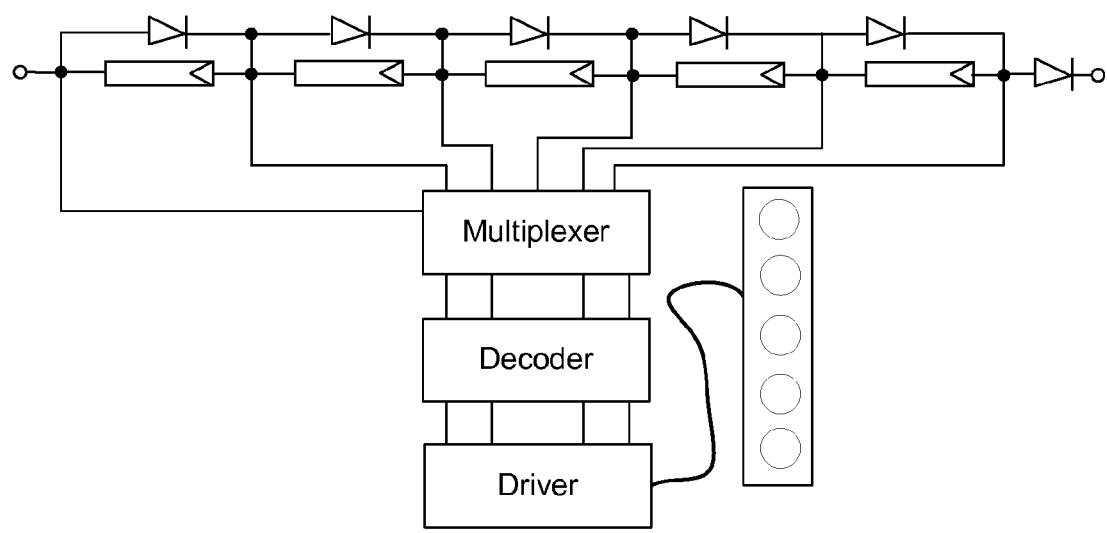
FIG. 10 is a schematic representation of an example of a serialized approach to monitoring the functionality and performance of concentrator cell chips for embodiments of the invention.
Figure 11:
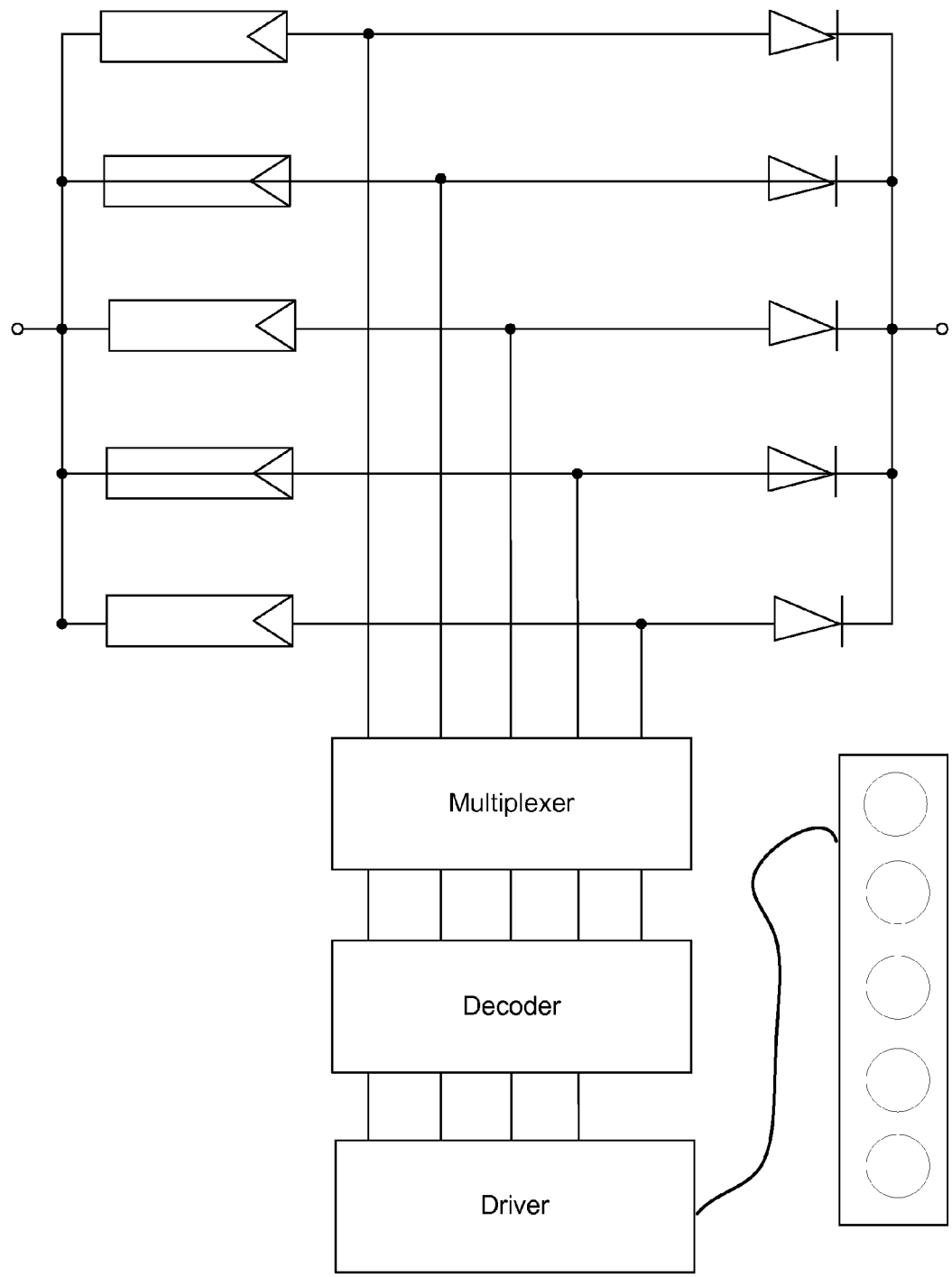
FIG. 11 is a schematic representation of an example of a parallelized approach to monitoring the functionality and performance of concentrator cell chips for embodiments of the invention.

FIG. 10 is a schematic representation of an example of serialized approach to monitoring the functionality and performance of concentrator cell chips for embodiments of the invention. FIG. 11 is a schematic representation of an example of parallelized approach to monitoring the functionality and performance of concentrator cell chips for embodiments of the invention. Having the advantage that individual concentrator cell chips are used, it is necessary to monitor their functionality and performance. FIGS. 10 and 11 illustrate examples of methods to do so that are for serialized as well as parallelized PCB's. The monitoring shows the cell status using, for example, red/green light indications. The signal can also be used to monitor the cell performances using a computer.

Embodiments of the invention propose a method for making a solar concentrator chip based solar module in such a simple manner that full automation is a must. Embodiments of the invention employ advanced assembly methods to parallelize and serialize the individual PCB's and enable easy replacement of individual cells as well as entire PCB's.

The flow diagrams depicted herein are only examples. There may be many variations to these diagrams or the steps (or operations) described therein without departing from the spirit of the invention. For example, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for manufacturing a solar concentrator cell module assembly within an integrated circuit process, the solar concentrator cell module assembly comprising at least one solar device, the at least one solar device comprising a printed circuit board and a cylindrical Fresnel lens, the method comprising:

assembling the printed circuit board according to a pre-defined printed circuit board design layout that allows pick and place of a solar concentrator cell chip onto the printed circuit board;

providing connections for the solar concentrator cell chip in a serialized or a parallelized arrangement on the printed circuit board;

forming at least one opening in the printed circuit board to enable attachment of a cooling finger;

placing the solar concentrator cell chip onto the printed circuit board;

attaching the cooling finger to the backside of the solar cell concentrator chip through the at least one opening in the printed circuit board; and assembling a solar device using the assembled printed circuit board and the cylindrical Fresnel lens, the solar device having a solar concentration ratio by modifying a surface of the solar device versus a surface of the solar cell and covering a full extension of the circuit board base, wherein assembling the solar device comprises:

placing the assembled printed circuit board in a base module comprising a metal frame adapted to hold the assembled printed circuit board and having a frame height that matches a focal length of the cylindrical Fresnel lens;

placing the base module on a fixture of a base substrate, the base substrate comprising one or more fixtures, each fixture adapted to hold a respective base module;

providing an active cooling mechanism within the base substrate to cool the base substrate with a liquid coolant; and coupling the cylindrical Fresnel lens to the base module; and assembling the solar concentrator cell module with the assembled solar device based on a pre-defined solar module layout.

2. The method of manufacturing the solar concentrator cell module of claim 1, further comprising:

monitoring the performance of the solar concentrator cell chip according to a serial or parallel connection of the assembled solar device.

* * * * *